(12) United States Patent
Lin

(10) Patent No.: US 10,264,709 B1
(45) Date of Patent: Apr. 16, 2019

(54) POWER OUTPUT END STRUCTURE OF POWER SUPPLY

(71) Applicant: CHYNG HONG ELECTRONIC CO., LTD., Taichung (TW)

(72) Inventor: Mu-Chun Lin, Taichung (TW)

(73) Assignee: CHYNG HONG ELECTRONIC CO., LTD., Taichung (TW)

( * ) Notice: Subject to any disclaimer, the term of this patent is extended or adjusted under 35 U.S.C. 154(b) by 0 days.

(21) Appl. No.: 15/943,359

(22) Filed: Apr. 2, 2018

(51) Int. Cl.
*H05K 7/20* (2006.01)
*H02B 1/20* (2006.01)
*H05K 7/14* (2006.01)
*H02M 7/00* (2006.01)
*H05K 7/06* (2006.01)

(52) U.S. Cl.
CPC .......... *H05K 7/2039* (2013.01); *H02B 1/20* (2013.01); *H02M 7/003* (2013.01); *H05K 7/1432* (2013.01); *H05K 7/06* (2013.01)

(58) Field of Classification Search
CPC ...... H05K 7/2039; H05K 7/1432; H05K 7/06; H02M 7/003; H02B 1/20
USPC ....................................... 174/72 B
See application file for complete search history.

(56) References Cited

U.S. PATENT DOCUMENTS

| 2012/0115004 A1* | 5/2012 | Park | H01M 2/105 429/120 |
| 2012/0288740 A1* | 11/2012 | Byun | H01M 2/021 429/96 |
| 2012/0315529 A1* | 12/2012 | Jin | H01M 10/647 429/120 |
| 2014/0355221 A1* | 12/2014 | Sawada | H05K 7/1432 361/735 |

* cited by examiner

*Primary Examiner* — Sherman Ng
(74) *Attorney, Agent, or Firm* — Ming Chow; Sinorica, LLC

(57) ABSTRACT

A power output end structure of a DC power supply is disclosed. The power supply includes a casing provided with a plurality of power modules. Output terminals of the power modules are electrically connected to a positive busbar and a negative busbar, respectively. The positive busbar and the negative busbar are in the form of a thin plate and arranged horizontally. The power modules are electrically connected in parallel or in series. Because the positive busbar and the negative busbar are in the form of a thin plate and arranged horizontally, the heat dissipation path in the casing won't be blocked so as to provide a better heat dissipation space and achieve a better heat dissipation effect.

10 Claims, 10 Drawing Sheets

US 10,264,709 B1

POWER OUTPUT END STRUCTURE OF POWER SUPPLY

FIELD OF THE INVENTION

The present invention relates to a power supply, and more particularly to a power output end structure of a power supply.

BACKGROUND OF THE INVENTION

With the development of technology, the efficacy of a power supply is improved increasingly. The power consumption is also increasing, which results in a large amount of waste heat. Waste heat usually accumulates in the power supply after it is generated, causing the temperature of the power supply to gradually increase. If the heat does not be exhausted, it may affect the operating efficiency of the internal components of the power supply and shorten the service life of the power supply.

A conventional power supply comprises a casing. The casing is provided with a plurality of power modules therein. A plurality of cooling fans are provided at the front side of the power modules and arranged in the longitudinal direction. The back of the cooling fans is provided with a back plate arranged in the longitudinal direction. The back plate is a flat plate and has a plurality of heat dissipation holes for exhausting the waste heat out of the power supply. However, the output ends of the power modules are connected with a plurality of wires to electrically connect the power modules in parallel or in series. Since the wires are staggered longitudinally and laterally, the wires will hinder the heat flow path when the cooling fans are running to dissipate heat. As a result, the waste heat cannot be smoothly discharged from the heat dissipation holes. Especially for a high-power power supply, the diameter of the wires is larger, which is more likely to obstruct the heat flow path and reduce heat dissipation effect. Accordingly, the inventor of the present invention has devoted himself based on his many years of practical experiences to solve these problems.

SUMMARY OF THE INVENTION

The primary object of the present invention is to provide a power output end structure of a DC power supply. The blocked area at the output end of the power supply can be reduced so as to provide a better heat dissipation space and achieve a better heat dissipation effect.

In order to achieve the aforesaid object, a power output end structure of a DC power supply is provided. The power supply comprises a casing. The casing is provided with a plurality of power modules. A positive busbar is in the form of a thin plate and horizontally disposed in the casing. One side of the positive busbar is electrically connected to positive output terminals of the power modules. Another side of the positive busbar is provided with a positive locking plate. A negative busbar is in the form of a thin plate and horizontally disposed in the casing. One side of the negative busbar is electrically connected to negative output terminals of the power modules. Another side of the negative busbar is provided with a negative locking plate.

In the power output end structure of the DC power supply provided by the present invention, because the positive busbar and the negative busbar are in the form of a thin plate and arranged horizontally, the heat dissipation path won't be blocked to provide a better heat dissipation space and achieve a better heat dissipation effect.

DETAILED DESCRIPTION OF THE PREFERRED EMBODIMENTS

Embodiments of the present invention will now be described, by way of example only, with reference to the accompanying drawings.

Figure 1:
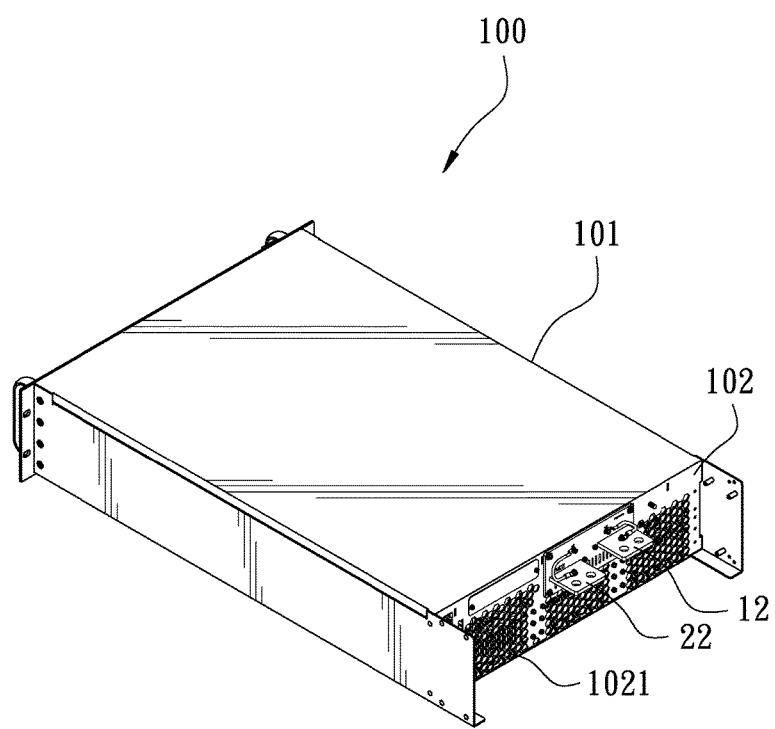
FIG. 1 is a perspective view of a power supply in accordance with a first embodiment of the present invention.
Figure 2:
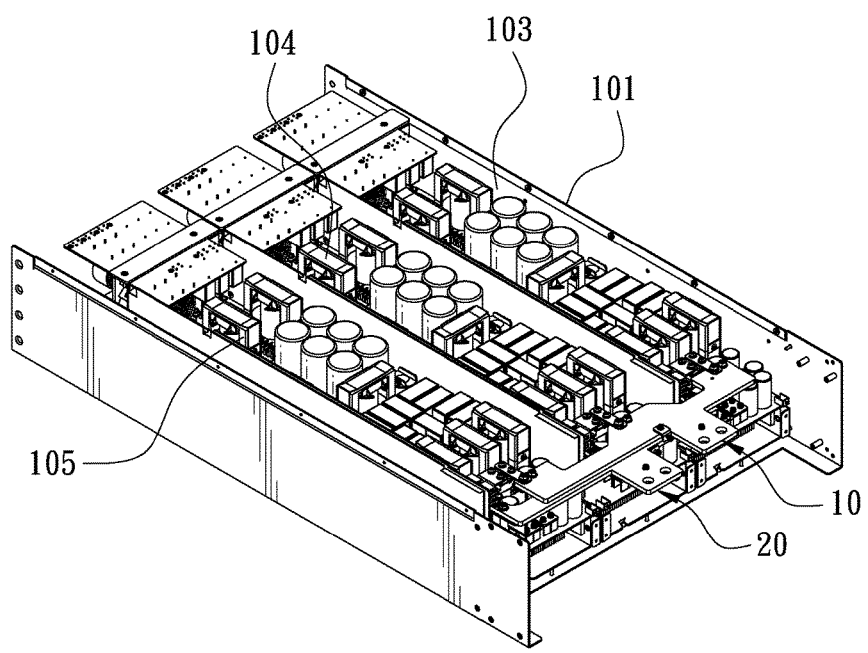
FIG. 2 is a perspective view showing the internal structure of a casing in accordance with the first embodiment of the present invention.
Figure 4:
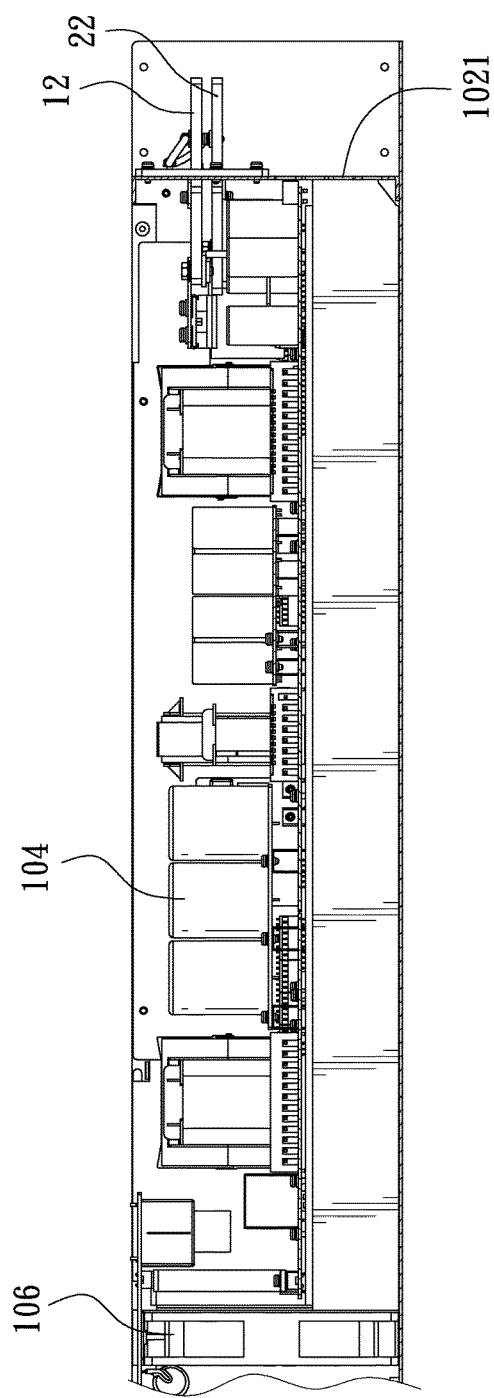
FIG. 4 is a sectional view showing the internal structure of the casing in accordance with the first embodiment of the present invention.

FIG. 1 is a perspective view of a power supply in accordance with a first embodiment of the present invention. FIG. 2 is a perspective view showing the internal structure of a casing in accordance with the first embodiment of the present invention. FIG. 4 is a sectional view showing the internal structure of the casing in accordance with the first embodiment of the present invention. The present invention discloses a power output end structure of a DC power supply. The power supply 100 comprises a casing 101, a positive busbar 10, a negative busbar 20, and an insulating plate 30.

Figure 3:
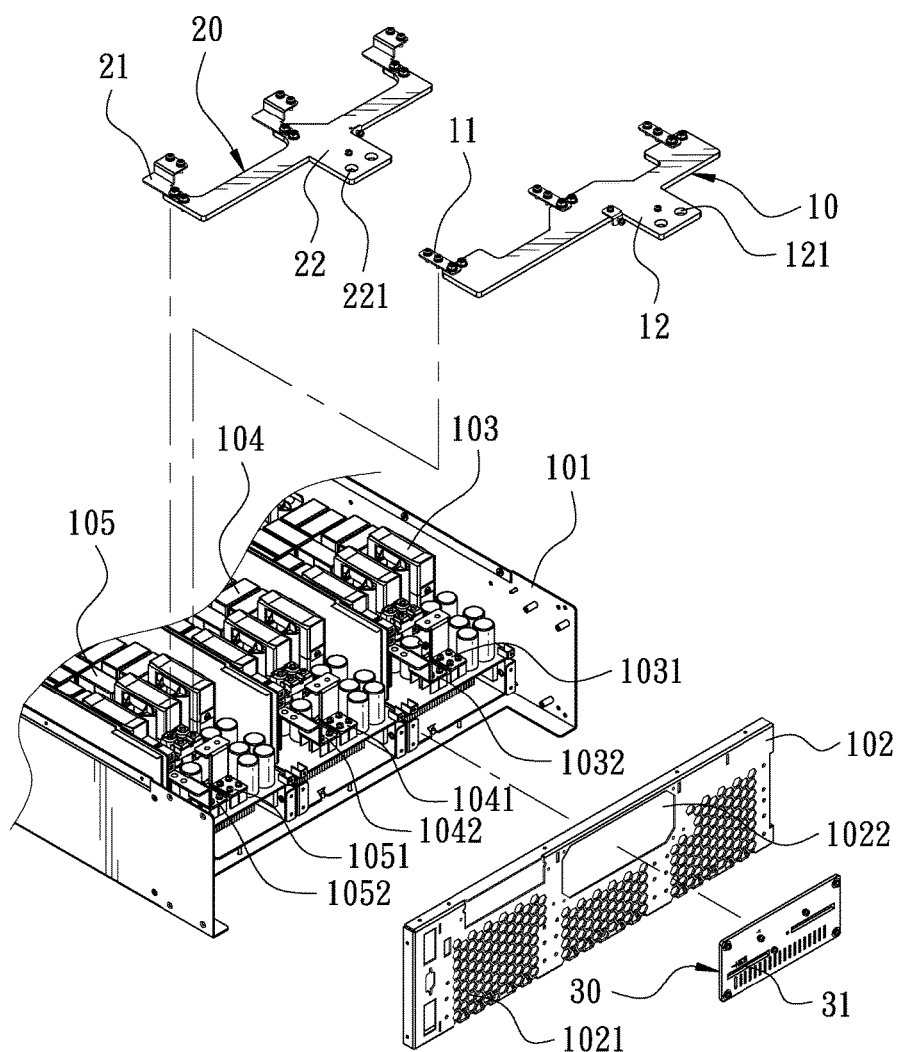
FIG. 3 is a partial exploded view showing the internal structure of the casing in accordance with the first embodiment of the present invention.

A rear side of the casing 101 is provided with a back plate 102. The back plate 102 is provided with a plurality of heat dissipation holes 1021. The power supply 100 includes a first power module 103, a second power module 104 and a third power module 105 arranged side by side in a direction perpendicular to the back plate 102. The front sides of the first power module 103, the second power module 104 and the third power module 105 are provided with cooling fans 106, respectively. Referring to FIG. 3, a rear side of the first power module 103 is provided with a first positive output terminal 1031 and a first negative output terminal 1032. A rear side of the second power module 104 is provided with a second positive output terminal 1041 and a second negative output terminal 1042. A rear side of the third power module 105 is provided with a third positive output terminal 1051 and a third negative output terminal 1052.

The positive busbar 10 is in the form of a thin E-shaped plate and is arranged horizontally. The positive busbar 10 is provided with a plurality of positive contacts 11 corresponding to the first positive output terminal 1031, the second positive output terminal 1041 and the third positive output terminal 1051, respectively. The positive contacts 11 are electrically connected to the first positive output terminal 1031, the second positive output terminal 1041 and the third positive output terminal 1051, respectively. The positive busbar 10 is provided with a positive locking plate 12 extending laterally towards the back plate 102. The positive locking plate 12 is provided with two perforations 121.

The negative busbar 20 is in the form of a thin E-shaped plate and is arranged horizontally. The negative busbar 20 is provided with a plurality of negative contacts 21 corresponding to the first negative output terminal 1032, the second negative output terminal 1042 and the third negative output terminal 1052, respectively. The negative contacts 21 are electrically connected to the first negative output terminal 1032, the second negative output terminal 1042 and the third negative output terminal 1052, respectively. The negative busbar 20 is provided with a negative locking plate 22 extending laterally and corresponding to the positive locking plate 12. The negative locking plate 22 is provided with two perforations 221.

The back plate 102 has a window 1022 corresponding to the insulating plate 30. The insulating plate 30 is configured to cover the window 1022. The insulating plate 30 has transverse holes 31 respectively corresponding to the positive locking plate 12 and the negative locking plate 22 for the positive locking plate 12 and the negative locking plate 22 to pass through the insulating plate 30.

After the power supply 100 is actuated, external three-phase AC flows to the first power module 103, the second power module 104 and the third power module 105 and is rectified to output DC. In this embodiment, the positive busbar 10 is electrically connected to the first positive output terminal 1031, the second positive output terminal 1041 and the third positive output terminal 1051, respectively; and the negative busbar 20 is electrically connected to the first negative output terminal 1032, the second negative output terminal 1042 and the third negative output terminal 1052, respectively. The first power module 103, the second power module 104 and the third power module 105 are connected in parallel with each other. After the power supply 100 is actuated, the power modules (103, 104, 105) generate waste heat during operation. At this time, waste heat is blown towards the back plate 102 through the cooling fans 106. Because the positive busbar 10 and the negative busbar 20 are in the form of a thin plate and arranged horizontally, the blocked area in the heat dissipation direction of the waste heat is minimized, and the waste heat can be smoothly discharged via the heat dissipation holes 1021 of the back plate 102 to provide a smooth heat flow path and enhance the heat dissipation efficiency. The present invention can achieve a better cooling effect in the existing casing, that is, with the same casing, the present invention can be applied to a general-purpose power supply with 180-460V, and has a larger output power value (up to 5 kW-15 kW) or current value (up to 30 A-540 A).

Figure 5:
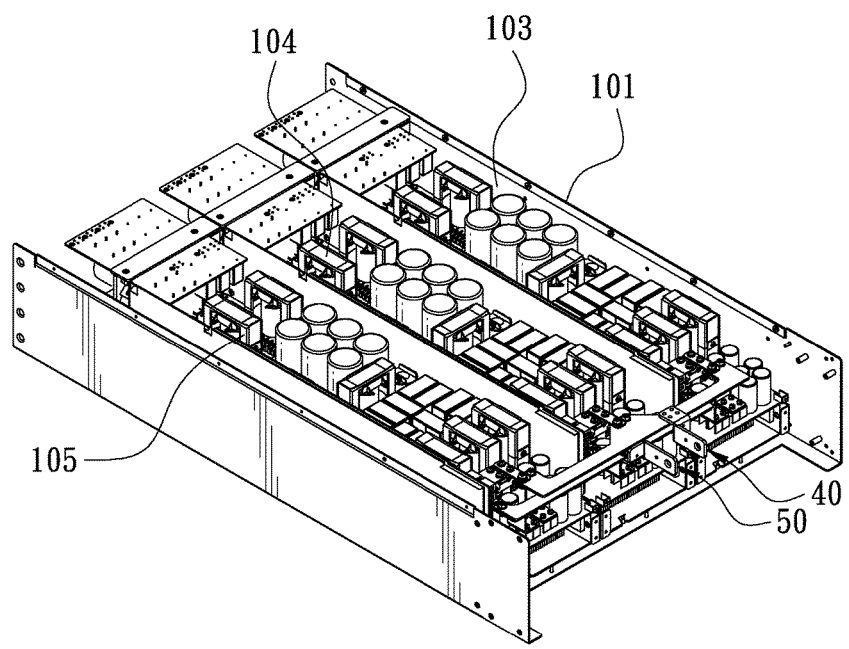
FIG. 5 is a perspective view showing the internal structure of the casing in accordance with a second embodiment of the present invention.
Figure 6:
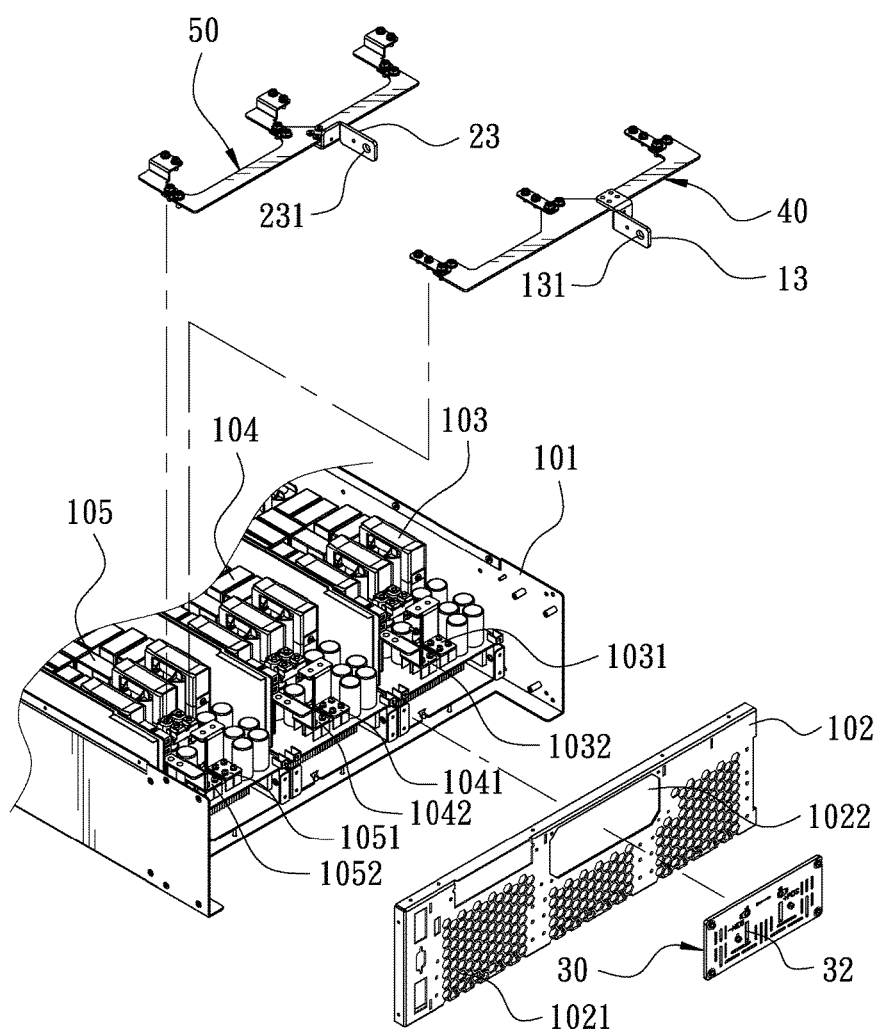
FIG. 6 is a partial exploded view showing the internal structure of the casing in accordance with the second embodiment of the present invention.
Figure 7:
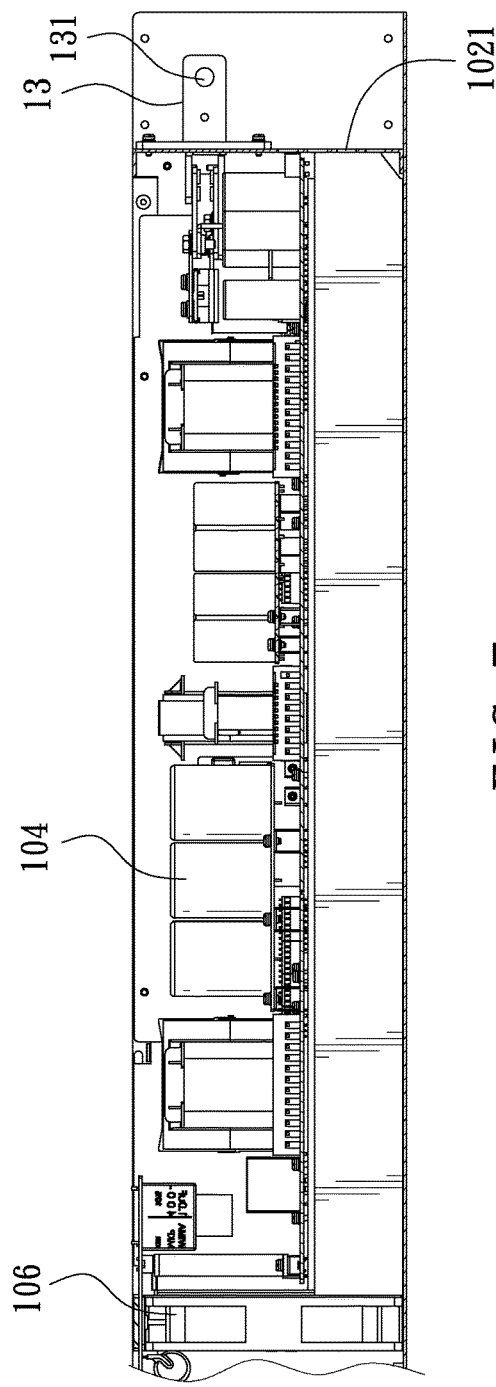
FIG. 7 is a sectional view showing the internal structure of the casing in accordance with the second embodiment of the present invention.

FIG. 5 is a perspective view showing the internal structure of the casing in accordance with a second embodiment of the present invention. FIG. 6 is a partial exploded view showing the internal structure of the casing in accordance with the second embodiment of the present invention. FIG. 7 is a sectional view showing the internal structure of the casing in accordance with the second embodiment of the present invention. The second embodiment of the present invention is substantially similar to the first embodiment with the exceptions described hereinafter. The positive busbar 40 is provided with the positive locking plate 13 extending longitudinally towards the back plate 102. The positive locking plate 13 is provided with a perforation 131. The negative busbar 50 is provided with the negative locking plate 23 extending longitudinally and corresponding to the positive locking plate 13. The negative locking plate 23 is provided with a perforation 231. The insulating plate 30 has longitudinal holes 31 respectively corresponding to the positive locking plate 13 and the negative locking plate 23 for the positive locking plate 13 and the negative locking plate 23 to pass through the insulating plate 30.

Figure 8:
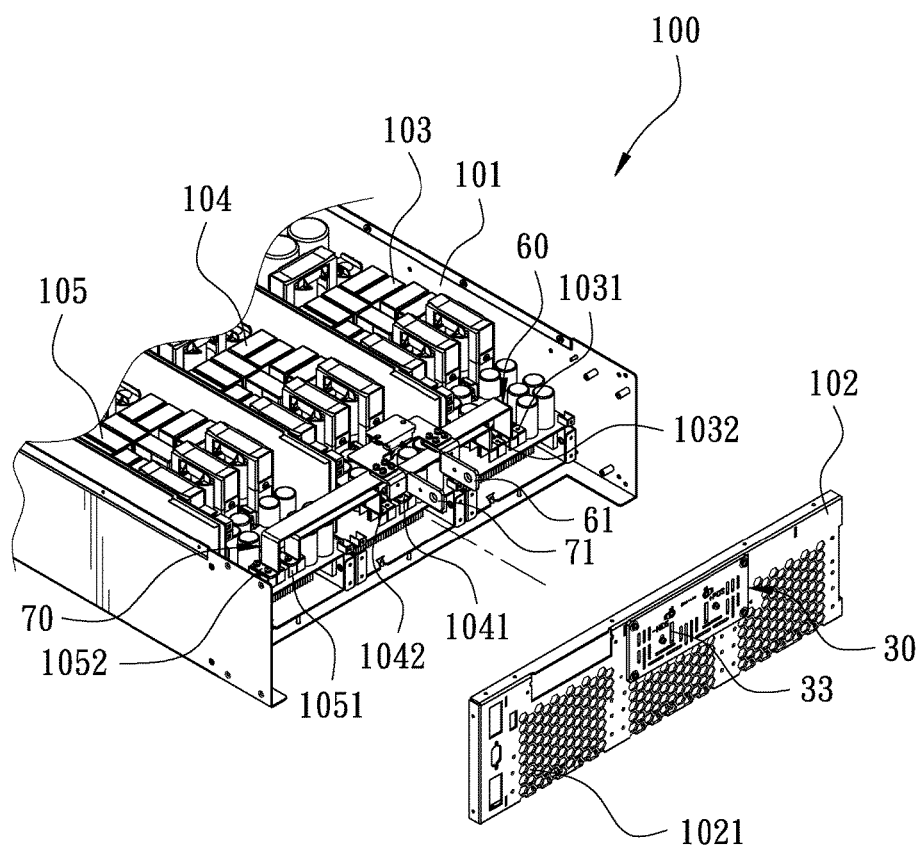
FIG. 8 is a partial exploded view showing the internal structure of the casing in accordance with a third embodiment of the present invention.
Figure 9:
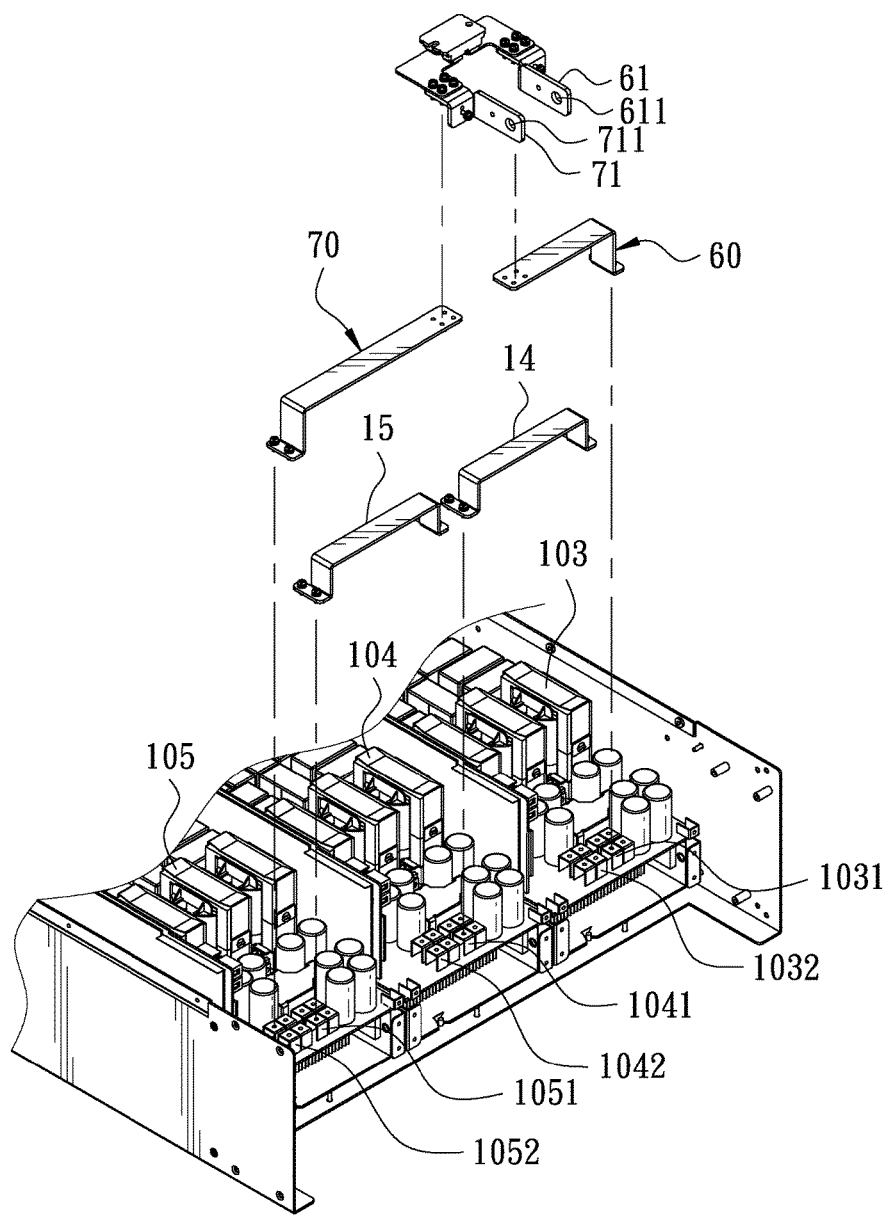
FIG. 9 is an exploded view showing the positive busbar and the negative busbar in accordance with the third embodiment of the present invention.
Figure 10:
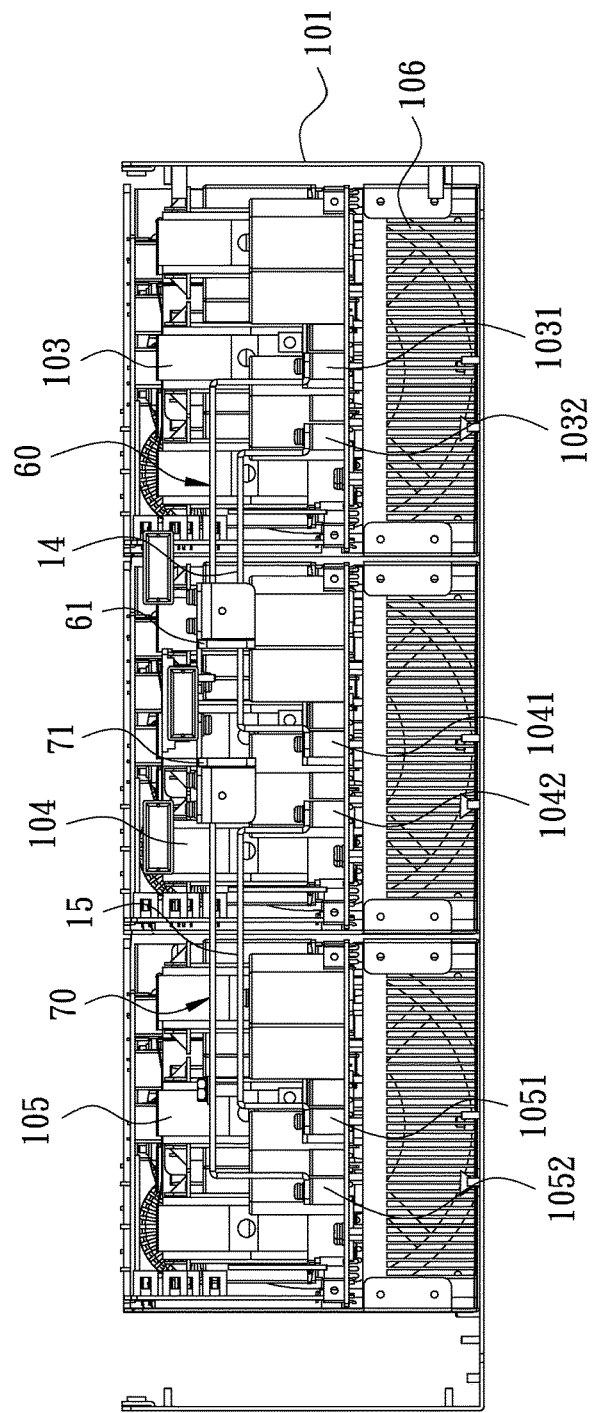
FIG. 10 is a rear view in accordance with the third embodiment of the present invention, without a back plate.

FIG. 8 is a partial exploded view showing the internal structure of the casing in accordance with a third embodiment of the present invention. FIG. 9 is an exploded view showing the positive busbar and the negative busbar in accordance with the third embodiment of the present invention. FIG. 10 is a rear view in accordance with the third embodiment of the present invention, without a back plate. The third embodiment of the present invention is substantially similar to the second embodiment with the exceptions described hereinafter. The positive busbar 60 is in the form of a thin L-shaped plate. One side of the positive busbar 60 is electrically connected to the first positive output terminal 1031 of the first power module 103. The first negative output terminal 1032 of the first power module 103 and the second positive output terminal 1041 of the second power module 104 are electrically connected to a first conductive plate 14. The second negative output terminal 1042 of the second power module 104 and the third positive output terminal 1051 of the third power module 105 are electrically connected to a second conductive plate 15. The first conductive plate 14 and the second conductive plate 15 each have a reverse U shape. The negative busbar 70 is in the form of a thin L-shaped plate. One side of the negative busbar 70 is electrically connected to the third negative output terminal 1052 of the third power module 105. The positive busbar 60 is provided with the positive locking plate 61 extending longitudinally towards the back plate 102. The positive locking plate 60 is provided with a perforation 611. The negative busbar 70 is provided with the negative locking plate 71 extending longitudinally and corresponding to the positive locking plate 61. The negative locking plate 71 is provided with a perforation 711. The insulating plate 30 has longitudinal holes 33 respectively corresponding to the positive locking plate 61 and the negative locking plate 71 for the positive locking plate 61 and the negative locking plate 71 to pass through the insulating plate 30. The first power module 103, the second power module 104 and the third power module 105 are connected in series, so the output current (I) is the same. After the power supply 100 is actuated, the power modules (103, 104, 105) generate waste heat during operation. At this time, waste heat is blown towards the back plate 102 through the cooling fans 106. Because the positive busbar 60 and the negative busbar 70 are in the form of a thin plate and arranged horizontally, the blocked area in the heat dissipation direction of the waste heat is minimized, and the waste heat can be smoothly discharged via the heat dissipation holes 1021 of the back plate 102 to provide a smooth heat flow path and enhance the heat dissipation efficiency. The present invention can achieve a better cooling effect in the existing casing, that is, with the same casing, the present invention can be applied to a general-purpose power supply with 180-460V, and has a larger output power value (up to 5 kW-15 kW) or voltage value (up to 80V-1500V).

Although particular embodiments of the present invention have been described in detail for purposes of illustration, various modifications and enhancements may be made without departing from the spirit and scope of the present invention. Accordingly, the present invention is not to be limited except as by the appended claims.

What is claimed is:

1. A power output end structure of a DC power supply, the power supply comprising a casing, the casing being provided with a plurality of power modules, characterized by:
   a positive busbar, in the form of a thin plate and horizontally disposed in the casing, a first side of the positive busbar being electrically connected to positive output terminals of the power modules, a second side of the positive busbar being provided with a positive locking plate;
   a negative busbar, in the form of a thin plate and horizontally disposed in the casing, a first side of the negative busbar being electrically connected to negative output terminals of the power modules, a second side of the negative busbar being provided with a negative locking plate.

2. The power output end structure of the DC power supply as claimed in claim 1, wherein a rear side of the casing is provided with a back plate, the power modules are arranged side by side in a direction perpendicular to the back plate, the power modules are defined as a first power module, a second power module and a third power module, a rear side of the first power module is provided with a first positive output terminal and a first negative output terminal, a rear side of the second power module is provided with a second positive output terminal and a second negative output terminal, a rear side of the third power module is provided with a third positive output terminal and a third negative output terminal; the positive busbar is provided with a plurality of positive contacts corresponding to the first positive output terminal, the second positive output terminal and the third positive output terminal respectively, the positive contacts are electrically connected to the first positive output terminal, the second positive output terminal and the third positive output terminal respectively; the negative busbar is provided with a plurality of negative contacts corresponding to the first negative output terminal, the second negative output terminal and the third negative output terminal respectively, and the negative contacts are electrically connected to the first negative output terminal, the second negative output terminal and the third negative output terminal, respectively.

3. The power output end structure of the DC power supply as claimed in claim 2, wherein the second side of the positive busbar is provided with the positive locking plate extending laterally towards the back plate, the positive locking plate is provided with two perforations, the second side of the negative busbar is provided with the negative locking plate extending laterally, and the negative locking plate is provided with two perforations.

4. The power output end structure of the DC power supply as claimed in claim 3, wherein the back plate has a window corresponding to the positive locking plate and the negative locking plate, an insulating plate is provided to cover the window, and the insulating plate has transverse holes respectively corresponding to the positive locking plate and the negative locking plate for the positive locking plate and the negative locking plate to pass through the insulating plate.

5. The power output end structure of the DC power supply as claimed in claim 2, wherein the second side of the positive busbar is provided with the positive locking plate extending longitudinally towards the back plate, the positive locking plate is provided with a perforation, the second side of the negative busbar is provided with the negative locking plate extending longitudinally, and the negative locking plate is provided with a perforation.

6. The power output end structure of the DC power supply as claimed in claim 5, wherein the back plate has a window corresponding to the positive locking plate and the negative locking plate, an insulating plate is provided to cover the window, and the insulating plate has longitudinal holes respectively corresponding to the positive locking plate and the negative locking plate for the positive locking plate and the negative locking plate to pass through the insulating plate.

7. The power output end structure of the DC power supply as claimed in claim 1, wherein a rear side of the casing is provided with a back plate, the power modules are arranged side by side in a direction perpendicular to the back plate, the power modules are defined as a first power module, a second power module and a third power module, a rear side of the first power module is provided with a first positive output terminal and a first negative output terminal, a rear side of the second power module is provided with a second positive output terminal and a second negative output terminal, a rear side of the third power module is provided with a third positive output terminal and a third negative output terminal; the first side of the positive busbar is electrically connected to the first positive output terminal of the first power module, the first side of the negative busbar is electrically connected to the third negative output terminal of the third power module, a first conductive plate is connected between the first negative output terminal of the first power module and the second positive output terminal of the second power module, and a second conductive plate is connected between the second negative output terminal of the second power module and the third positive output terminal of the third power module.

8. The power output end structure of the DC power supply as claimed in claim 7, wherein the second side of the positive busbar is provided with the positive locking plate extending longitudinally towards the back plate, the positive locking plate is provided with a perforation, the second side of the negative busbar is provided with the negative locking plate extending longitudinally, the negative locking plate is provided with a perforation, the back plate is provided with an insulating plate, and the insulating plate has longitudinal holes respectively corresponding to the positive locking plate and the negative locking plate for the positive locking plate and the negative locking plate to pass through the insulating plate.

9. The power output end structure of the DC power supply as claimed in claim 1, wherein the positive busbar and the negative busbar each have an E shape.

10. The power output end structure of the DC power supply as claimed in claim 7, wherein the positive busbar and the negative busbar each have an L shape, and the first conductive plate and the second conductive plate each have a reverse U shape.

* * * * *